(12) United States Patent
Wessel et al.

(10) Patent No.: US 6,217,440 B1
(45) Date of Patent: Apr. 17, 2001

(54) AIR MOVER SYSTEM WITH REDUCED REVERSE AIR FLOW

(75) Inventors: Mark William Wessel, New Oxford; Grant M. Smith, Bryn Athyn, both of PA (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/182,273

(22) Filed: Oct. 29, 1998

(51) Int. Cl.[7] .................................................. H05K 7/20
(52) U.S. Cl. ............................................. 454/184; 361/695
(58) Field of Search .................................... 454/184, 338, 454/341; 361/695

(56) References Cited

U.S. PATENT DOCUMENTS

| | | |
|---|---|---|
| 2,143,372 | 1/1939 | Frink . |
| 2,702,100 | 2/1955 | Montieth ............................. 188/110 |
| 2,737,018 | 3/1956 | Bain et al. .......................... 60/39.14 |
| 3,176,173 | 3/1965 | Straub et al. ......................... 310/59 |
| 3,275,083 | 9/1966 | Allin ................................. 170/160.13 |
| 3,339,425 | 9/1967 | Seiden ..................................... 74/393 |
| 3,560,109 | 2/1971 | Lewis ..................................... 416/169 |
| 3,849,024 | * 11/1974 | Masai et al. ........................... 415/213 |
| 3,960,465 | 6/1976 | Robison ............................. 416/169 R |
| 4,376,614 | 3/1983 | Woodruff ................................ 416/32 |
| 4,567,965 | 2/1986 | Woodruff ................................ 188/68 |
| 4,642,029 | 2/1987 | Cedoz .................................... 416/129 |
| 4,648,007 | * 3/1987 | Garner ............................. 454/184 X |
| 5,035,575 | 7/1991 | Nielsen et al. ........................... 416/9 |
| 5,438,226 | 8/1995 | Kuchta .................................. 307/125 |
| 5,470,197 | 11/1995 | Cafarelli ................................. 415/90 |
| 5,562,418 | 10/1996 | Agius ............................... 416/169 R |
| 5,795,270 | * 8/1998 | Woods et al. . |
| 5,890,959 | * 4/1999 | Petit et al. ............................. 454/184 |

* cited by examiner

Primary Examiner—Harold Joyce
(74) Attorney, Agent, or Firm—Rocco L. Adornato; Mark T. Starr; Ratner & Prestia (57) ABSTRACT

An air mover system is provided having plural air movers each mounted along an air flow path. Each of the air movers includes means mounted for forward rotation to generate forward air flow. Each of the air movers also includes means for preventing reverse rotation of the air flow generating means, thereby reducing reverse air flow.

17 Claims, 12 Drawing Sheets

AIR MOVER SYSTEM WITH REDUCED REVERSE AIR FLOW

FIELD OF THE INVENTION

The present invention relates generally to an improved air mover system and, more particularly, to an air mover system adapted to reduce reverse air flow.

BACKGROUND OF THE INVENTION

There is an ever-increasing need for electronic devices and systems having improved reliability. One potential source of failure for an electronic system is its cooling system. The electronic components of such systems typically generate a considerable amount of heat in an enclosed or semi-enclosed space. It is often necessary to provide a cooling system in order to prevent temperature gradients that could compromise the function of such electronic components.

One method of cooling is the use of an air mover such as a fan or impeller in order to establish air flow across the electronic components. Such air flow facilitates the dissipation of generated heat by convection heat transfer. In some cooling systems, multiple air movers are mounted in a bank arrangement wherein each of the air movers moves a portion of the air that is being used to cool the electronic system, and the air movers in combination provide the cooling capacity necessary to cool the electronic system.

Multiple air movers are sometimes mounted to move air along air flow paths that are arranged in a parallel orientation. This is not to say that the air flow paths are arranged parallel with respect to one another in the geometric sense; instead, such parallel orientation refers to the movement by each of the air movers of a separable portion of the air flow so that the combined effort of the air movers is sufficient to generate a total air flow requirement for suitable heat transfer.

It has been discovered, however, that the failure of one or more air movers in a system having multiple air movers can change the air-flow pattern in a manner that compromises the dissipation of heat generated by the electronic system. For purposes of illustration, FIGS. 1 and 2 show schematic representations of examples of air moving systems that include multiple air movers.

Figure 1:
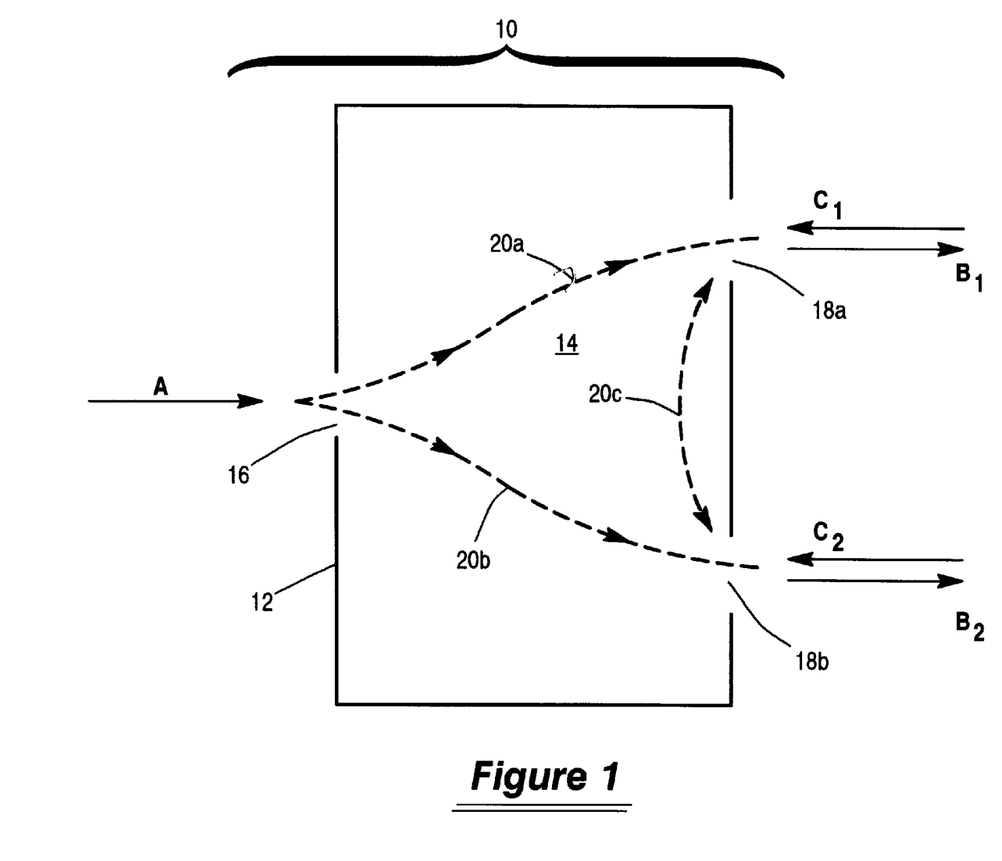
FIG. 1 is a schematic view of an embodiment of an air mover system.
Figure 2:
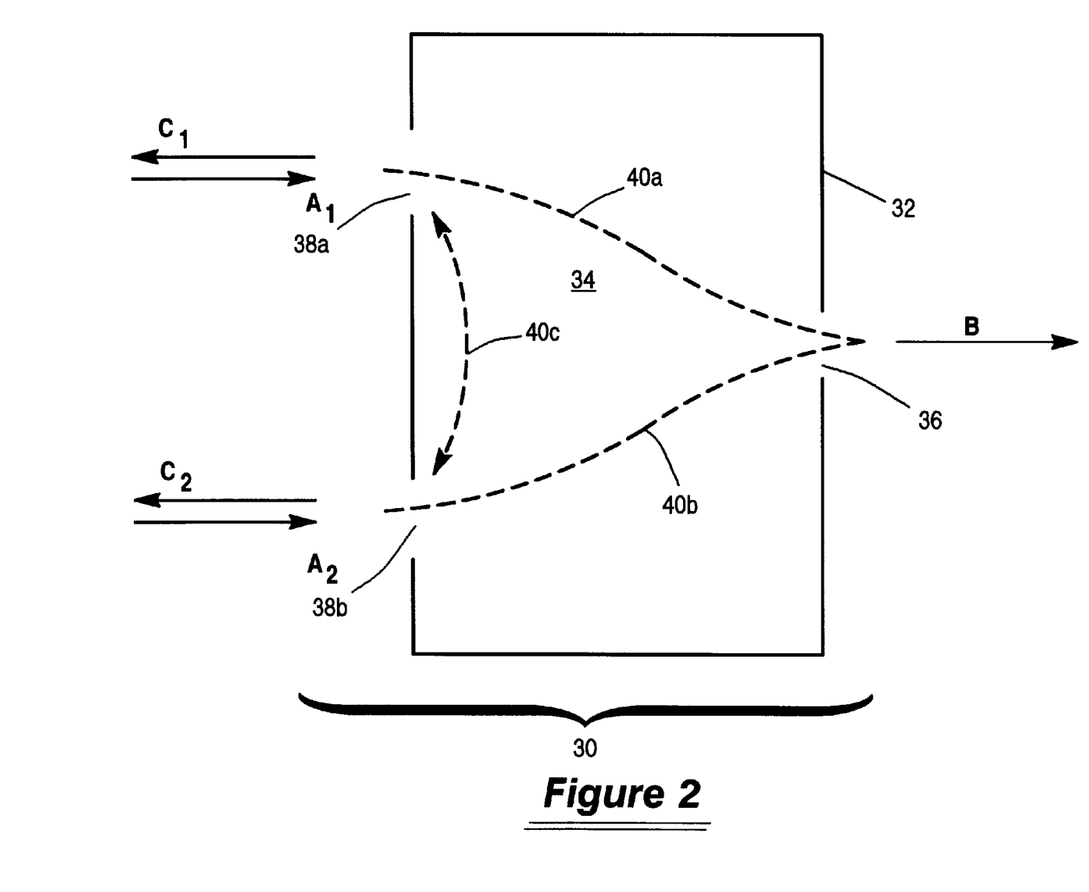
FIG. 2 is a schematic view of another embodiment of an air mover system.

Referring first to FIG. 1, an air moving system (generally designated by the numeral "10") is intended to dissipate heat that is generated within an enclosure 12 such as a cabinet, chassis, housing or other structure. The enclosure 12 has an interior 14 in which an electronic system can be mounted. Enclosure 12 also has one or more openings such as an opening 16 for intake air flow as well as a pair of openings 18a and 18b for exhaust air flow. Air movers (not shown) are oriented to urge air flow through opening 16, into interior 14, and out to the exterior of enclosure 12 through openings 18a and 18b. More specifically, intake air flow "A" is urged into opening 16 and exhaust air flow "$B_1$" and "$B_2$" is urged outwardly through openings 18a and 18b, respectively. Air is therefore caused to flow along primary air flow paths 20a and 20b, which are shown in FIG. 1 as dotted lines extending from opening 16 to openings 18a and 18b.

Although not shown in FIG. 1, it will be understood that an air mover is positioned anywhere along each of the primary air flow paths 20a and 20b in order to urge air flow along the respective paths. For example, an air mover can be positioned within interior 14 proximal to each opening 18a and 18b, near opening 16, or anywhere in the space between opening 16 and 18a or 18b. These air movers cooperate to generate intake air flow A by producing a low pressure zone within interior 14 of enclosure 12, thereby drawing air into the enclosure and then forcing air outwardly in the form of exhaust air flow $B_1$ and $B_2$.

It has been discovered that the failure of an air mover can result in reverse air flow through the exhaust openings and that such reverse air flow can change the air flow pattern detrimentally and reduce the cooling air flow that is directed across the heat-generating components of the electronic system. For example, if an air mover positioned along primary air flow path 20a fails, exhaust air flow $B_1$ will be replaced by reverse air flow "$C_1$" through opening 18a due to the low pressure zone within interior 14. Similarly, failure of an air mover oriented along primary air flow path 20b would result in the replacement of exhaust air flow $B_2$ with reverse air flow "$C_2$" through opening 18b. A failure of an air mover oriented along primary air flow paths 20a or 20b would therefore tend to result in air flow along a secondary air flow path 20c between openings 18a and 18b. For example, if an air mover positioned along primary air flow path 20a were to fail, then reverse air flow $C_1$ through opening 18a would travel along secondary air flow path 20c to opening 18b. Such a change in the air flow pattern reduces the flow of air across the heat-generating electronic components and also re-directs air flow away from portions of the interior 14 of enclosure 12.

Referring now to FIG. 2, an air mover system 30 also includes an enclosure 32 with an interior 34, as well as openings 36 for exhaust air flow and 38a and 38b for intake air flow. The air mover system 30 in FIG. 2 differs from the one illustrated in FIG. 1 because it is adapted for the use of air movers (not shown) that are positioned proximal to openings 38a and 38b to urge intake air flow $A_1$ and $A_2$ into interior 34 and out from interior 34 as exhaust air flow B by creating a high pressure zone within interior 34. Accordingly, air movers positioned along primary air flow paths 40a and 40b urge air through the interior 34 from openings 38a and 38b to opening 36. Failure of an air mover therefore would result in reverse air flow $C_1$ or $C_2$ as well as air flow along a secondary air flow path 40c.

As illustrated in FIGS. 1 and 2, it has been discovered that the failure of an air mover in an air moving system that utilizes multiple air movers can compromise the cooling effect significantly. Not only does such a failure reduce the intake and exhaust air flow by eliminating the contribution of the failed air mover, but such a failure also results in a detrimental change in the air flow pattern and air flow rate within the enclosure from which heat is being dissipated.

Attempts have been made in the past in order to overcome this problem. For example, U.S. Pat. No. 5,438,226, issued to Douglas A. Kuchta, describes the use of louvers that can be added to a fan assembly in order to prevent backwards flow of air through the opening of a failed fan. The Kuchta patent also discloses the arrangement of air movers in series with respect to the air flow as opposed to banked designs which arrange fans in parallel with the air flow. The series air moving system proposed by the Kuchta patent is intended to reduce hot spots which may result when one fan in a parallel fan bank fails and to reduce backward air flow through a failing air mover because the remaining air mover in series establishes flow in the proper direction.

Nevertheless, there remains a need for an improved air mover system that is capable of reducing reverse air flow in the event that one or more of multiple air movers fails.

SUMMARY OF THE INVENTION

In order to achieve the aforementioned objectives and to overcome the disadvantages associated with conventional air mover systems, this invention provides a system adapted for generating air flow using multiple air movers. Each of the air movers is mounted along a desired air flow path.

Each air mover includes means mounted for rotation to generate forward air flow along an air flow path. Each air mover also has means for preventing reverse rotation, thereby reducing reverse air flow along the air flow path.

The air movers can include an impeller or a fan blade or other rotating means for generating air flow. A breaking arm, one-way bearing or other means for preventing reverse rotation can be mounted so that it is capable of permitting forward rotation while preventing reverse rotation. A motor can be used to cause the forward rotation.

It has been discovered that the prevention of reverse rotation of a failed or failing air mover can significantly reduce the amount of reverse air flow into an enclosure through an exhaust opening. Accordingly, an air mover system according to this invention reduces the impact of a failed air mover.

DETAILED DESCRIPTION OF THE INVENTION

The invention will now be described with reference to several embodiments selected for illustration in the drawings. It will be appreciated that the invention is not limited to the illustrated embodiments and that the drawings are not made to any proportion or scale. Instead, the invention is defined separately in the appended claims.

FIGS. 1 and 2, which illustrate schematically two air mover system embodiments and the air flow pattern through such systems, have been described previously. The invention will now be described in detail with reference to specific embodiments selected for illustration in FIGS. 3–16.

Figure 3:
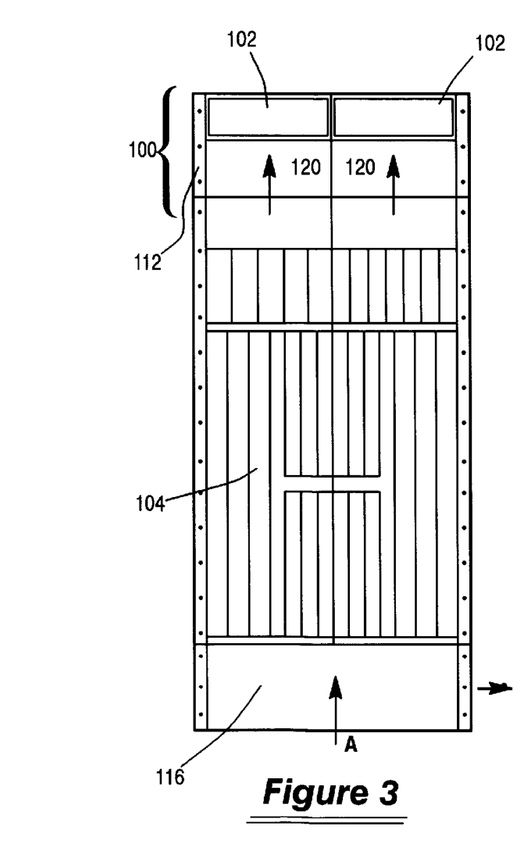
FIG. 3 is a front view of an assembly including an embodiment of an air mover system according to this invention.
Figure 4:
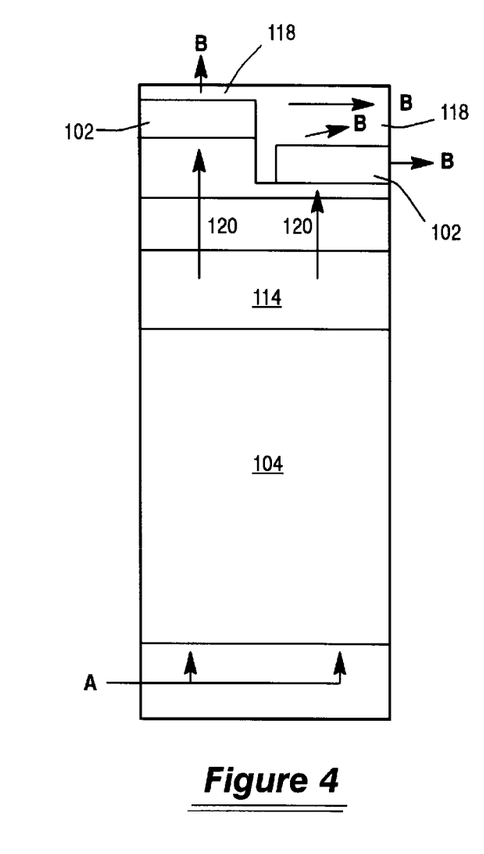
FIG. 4 is a side view of the assembly shown in FIG. 3.
Figure 5:
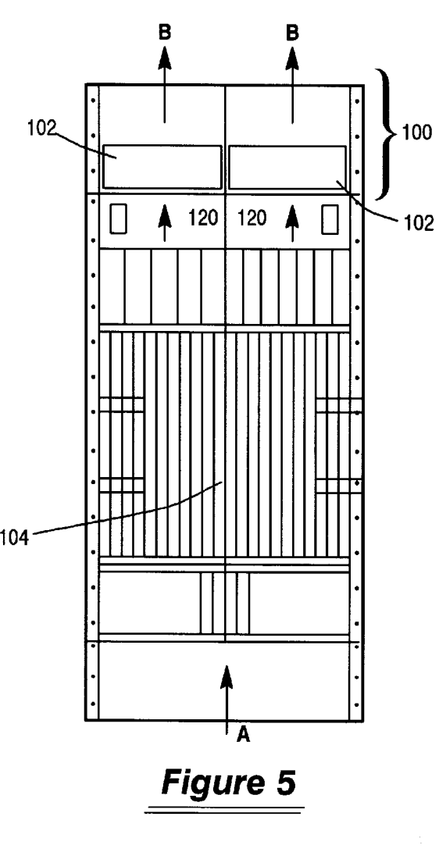
FIG. 5 is a rear view of the assembly shown in FIG. 3.

FIGS. 3–5 illustrate an embodiment of an air mover system, generally designated by the numeral "100," in the form of a cooling module that is mounted on the top of an enclosure for an electronic system. It will be appreciated that air mover system 100 can instead be incorporated into the electronic system enclosure as an integral unit.

FIG. 3 shows a front view of air mover system 100. In this view, two of four air movers 102 can be seen at the top of air mover system 100. The air movers 102 are mounted within an enclosure 112. The enclosure 112 is mounted on top of an enclosure for an electronic system 104, which includes racks for various electronic modules. An air inlet opening 116 is located toward the bottom of the lower enclosure portion. Intake air "A" flows upwardly through electronic system 104 and then flows along air flow paths 120 toward the air movers 102. Air mover system 100 is similar to the air mover system 10 illustrated in FIG. 1 in that intake air flow A enters an enclosure through an opening and exists the enclosure through multiple paths, as will be described further with reference to FIGS. 4 and 5.

Referring now to the side view shown in FIG. 4, air flow paths 120 are generated through an interior 114 of air mover system 100 and extend toward air movers 102. By action of the air movers 102, air flows outwardly from enclosure 112 through several exhaust openings 118. The direction of exhaust air flow is indicated by the arrows labeled "B."

FIG. 5 shows a rear view of air mover system 100. FIGS. 3–5 together illustrate that the air movers 102 of this embodiment can be oriented in two planes. Although not visible in these figures, each air mover 102 includes a means, such as an impeller wheel of an impeller, which rotates about a vertical axis in order to urge air flow upwardly and radial outwardly for exhaust from the air mover system 100.

It will be understood that air movers 102 can be impellers, fans, or any other means for moving air along a path. Air movers 102 are positioned in a bank to generate separable air flow paths in parallel arrangement. Together, the air movers cooperate to generate a combined air flow across the electronic system 104 that is capable of dissipating the heat generated by components of the electronic system 104.

Figure 6:
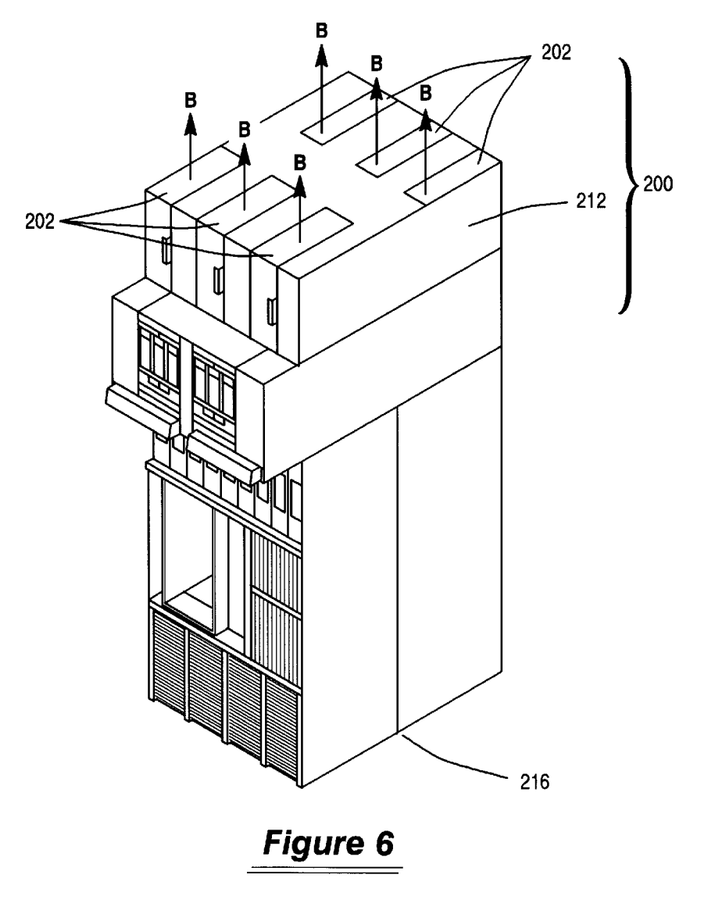
FIG. 6 is a perspective view of an assembly including another embodiment of an air mover system according to this invention.

FIG. 6 shows a perspective view of another embodiment of an air mover system according to this invention designated generally by the numeral "200." As with the embodiment illustrated in FIGS. 3–5, air mover system 200 is also modular in construction in that it can be mounted to another enclosure portion for containing various electronic modules. An opening 216 is provided for intake air flow A. Six air movers 202 are oriented in an enclosure 212 for urging air flow upwardly through openings at the top surface of enclosure 212. Although not visible in FIG. 6, each air mover 202 includes a means, such as an impeller wheel of an impeller, for rotation about a horizontal axis. Such rotation causes exhaust air flow B.

Figure 7:
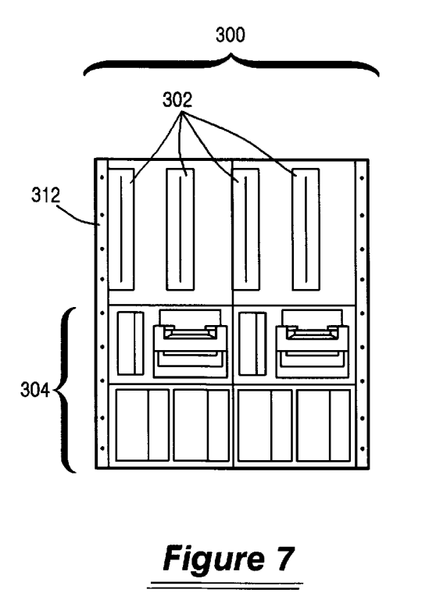
FIG. 7 is a front view of an assembly including yet another embodiment of an air mover system according to this invention.
Figure 8:
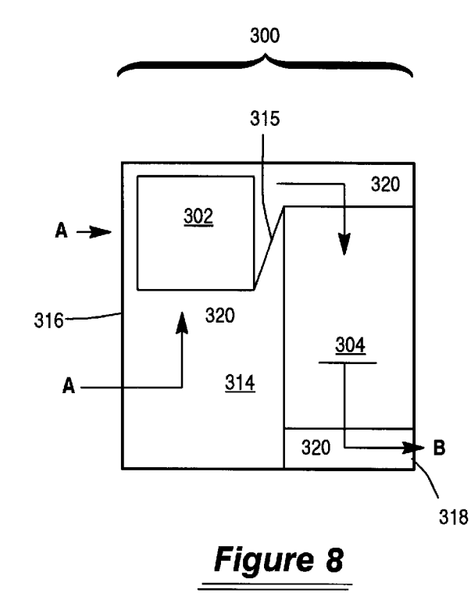
FIG. 8 is a side view of the assembly shown in FIG. 7.
Figure 9:
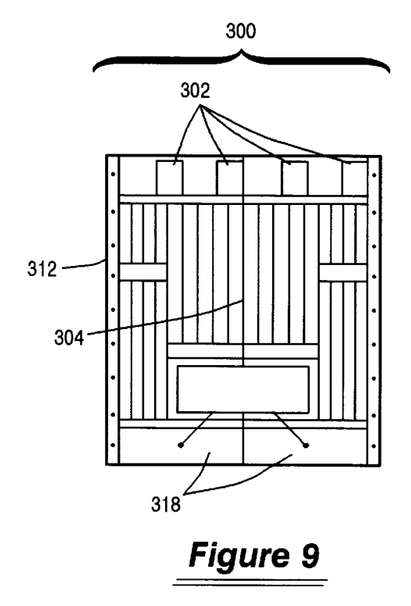
FIG. 9 is a rear view of the assembly shown in FIG. 7.

FIGS. 7–9 illustrate yet another embodiment of an air mover system designated generally by the numeral "300." Air mover system 300 differs from air mover systems 100 and 200 in that the air movers 302 of air mover system 300 are mounted in the same overall enclosure 312 as the electronic system 304, in an integral and unitary assembly. Although air movers 302 can be removed and replaced if necessary, they are not a part of a separate air mover module that can be attached and detached from a separate enclosure for the electronic system. Air mover system 300 is similar to the schematic system shown in FIG. 2 because the air movers 302 are positioned proximal or adjacent to intake air openings for urging air flow through the enclosure 312 and out through a substantially common outlet opening 318.

Referring specifically to FIG. 7, which shows a front view of air mover system 300, the four air movers 302 are mounted next to one another. Although not shown in FIG. 7, air movers 302 include means such as impeller wheels of impellers that are mounted for rotation about a horizontal axis as in air mover system 200. As shown in the side view of FIG. 8, a baffle 315 is used to direct air flow from air movers 302 along a path or paths 320 that extend through the electronic system 304. The air flow can then exit enclosure 312 through outlet opening 318. FIG. 9, which provides a rear view of air mover system 300, shows a substantially common outlet opening 318 that can be divided into two halves by a wall 319.

Figure 10:
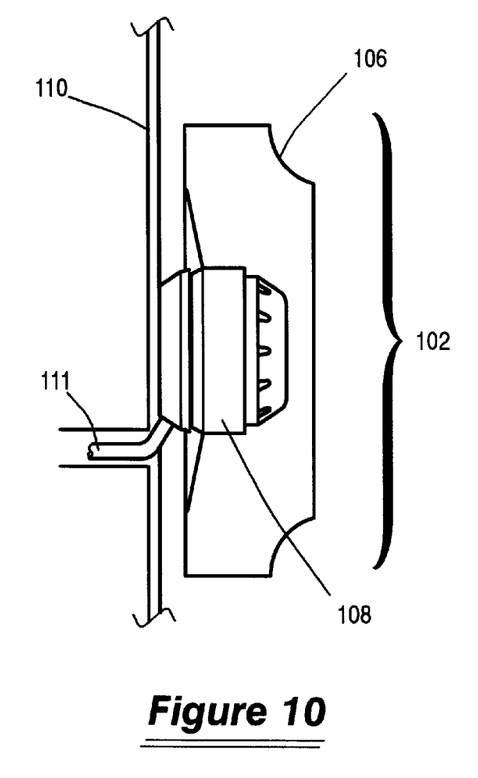
FIG. 10 is a side view of an embodiment of an air mover adapted for use in an air mover system according to this invention.

Details of one embodiment of an air mover capable of use in an air mover system according to this invention are illustrated in FIG. 10. In this embodiment, air mover 102 is an impeller having an impeller wheel 106 driven by a motor 108. The motor 108 is in turn mounted to its impeller housing or to the system enclosure by means of a mounting plate 110 and a cable 111. Suitable motorized impellers include the backward curved motorized impellers provided by McLean Engineering of Princeton Junction, N.J. Also, Papst Mechatronic Corporation of Newport, R.I. offers a suitable component under the trademark "FLATPAK." Generally speaking, such motorized impellers and fans utilize a wheel that is connected to a motor, further details of which will be provided later with reference to FIG. 16. The wheel has various outwardly-extending blades that direct air flow longitudinally along the axis of rotation and/or radially outwardly with respect to the axis of rotation when the wheel is rotated in a forward direction (i.e., for forward air flow).

The motorized impeller illustrated in FIG. 10 is one example of a suitable means for generating air flow along an air flow path, according to this invention. Box fans and other devices having rotating members for generating air flow can be substituted.

FIGS. 11 through 15 illustrate preferred embodiments of a means for preventing reverse rotation of an air mover component in order to reduce reverse air flow according to this invention. It will be appreciated that equivalent means can be substituted so long as they are capable of preventing reverse rotation.

Figure 11:
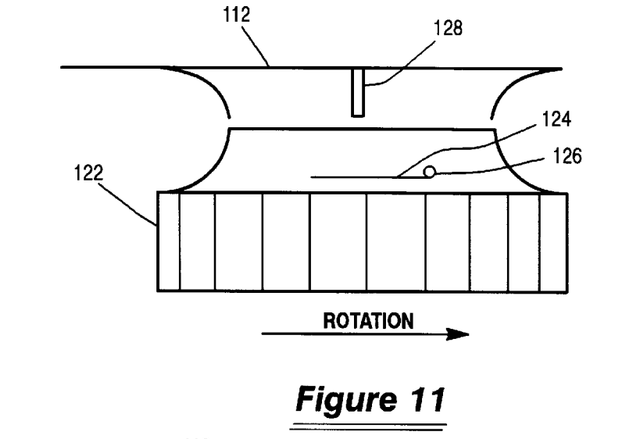
FIG. 11 is a schematic top view of a portion of an air mover system according to this invention during forward rotation.
Figure 12:
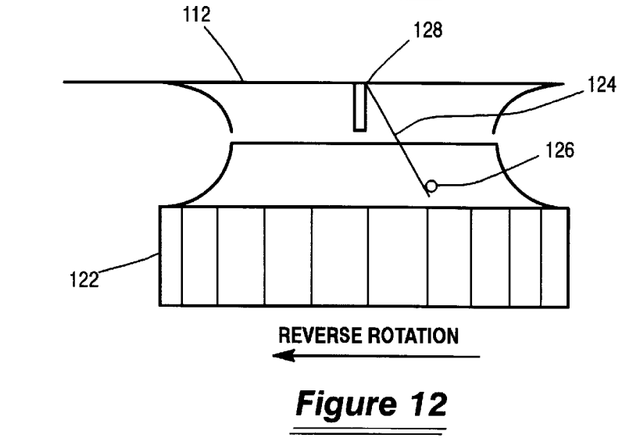
FIG. 12 is a schematic top view of the portion of the air mover system shown in FIG. 11, in the event of reverse rotation.

Referring to FIGS. 11 and 12, the means for preventing reverse rotation includes a member such as a breaking arm that is attached to the wheel of an impeller. As shown in FIG. 11, which illustrates a view from the top of an impeller wheel 122, a breaking arm 124 is connected to impeller wheel 122 at a pivot point 126. During forward rotation of impeller wheel 122 as shown by the arrow in FIG. 11, the movement of the impeller wheel and air resistance maintains breaking arm 124 in the retracted position as shown. Accordingly, breaking arm 124 does not contact a stop 128 that is mounted adjacent to the impeller or system enclosure 112.

Referring now to FIG. 12, reverse rotation of impeller wheel 122 in the direction indicated by the arrow causes the breaking arm 124 to pivot outwardly at pivot 126. Such movement of breaking arm 124 is the direct result of any significant reverse rotation. Accordingly, within one or more rotations of impeller wheel 122, breaking arm 124 contacts stop 128 to prevent further reverse rotation.

Although its structure is not critical to this invention, breaking arm 124 is preferably formed from a rigid plastic or metallic material. The pivot 126 can be a hinge component attached for connection between the breaking arm 124 and the wheel 122.

Figure 13:
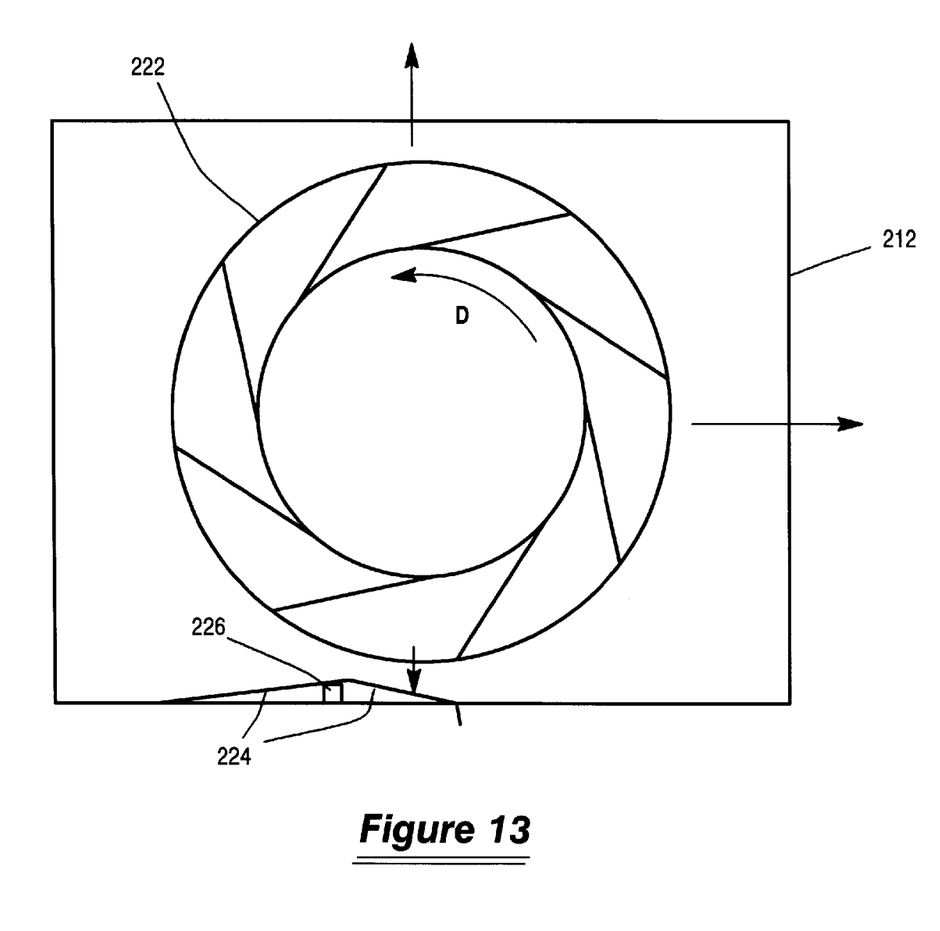
FIG. 13 is a schematic front view of a portion of another embodiment of an air mover system according to this invention during forward rotation.

Referring now to FIG. 13, an impeller wheel 222 is shown during forward rotation in a direction D. This is a front view of impeller wheel 222. In this embodiment, the breaking arm 224 is formed from a somewhat flexible material, such as a thin sheet of fiber board, that is connected to the impeller or system enclosure 212. Breaking arm 224 is mounted to rest against a pivot point 226 that is also mounted to the enclosure 212. As shown in FIG. 13, forward rotation of impeller wheel 222 causes air to flow radially outwardly with respect to the axis of impeller wheel 222, thereby deflecting the flexible breaking arm 224 away from the impeller wheel, and thereby preventing contact therebetween. Although many possible materials are contemplated for breaking arm 224, thin "FR-4" board has been discovered to be a suitable material.

Figure 14:
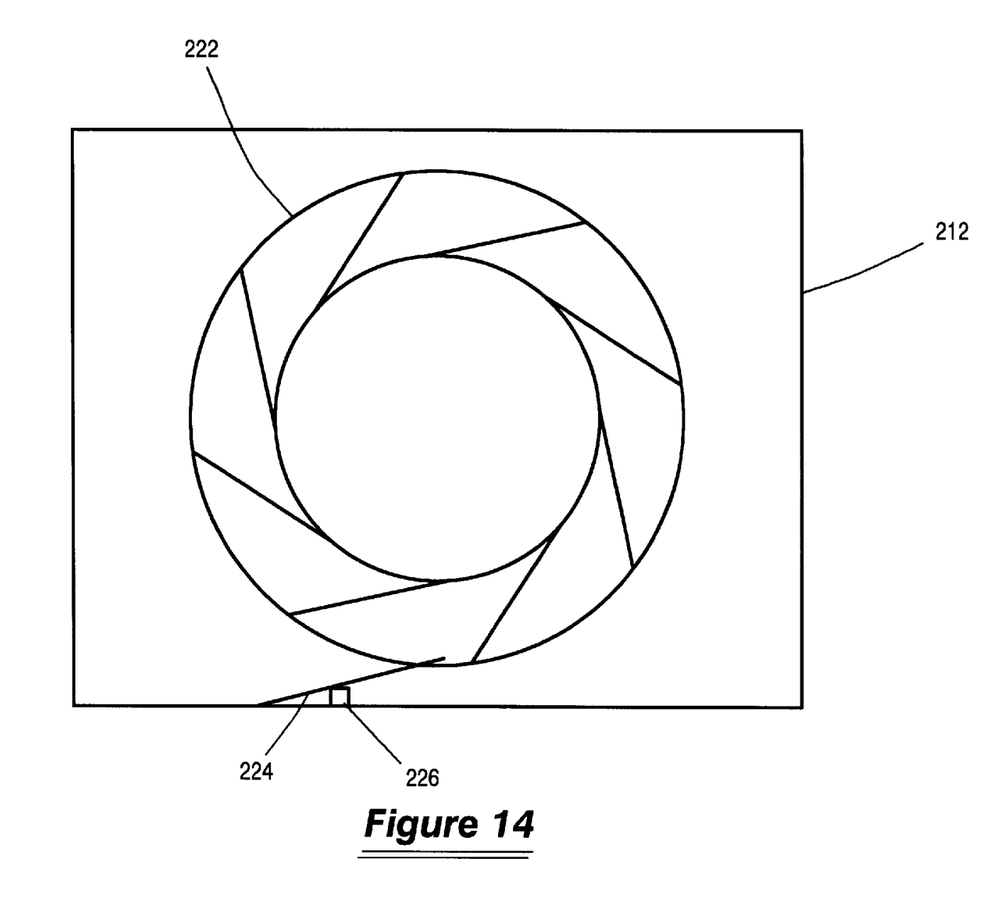
FIG. 14 is a schematic front view of the portion of the air mover system shown in FIG. 13, with the air mover at rest.
Figure 15:
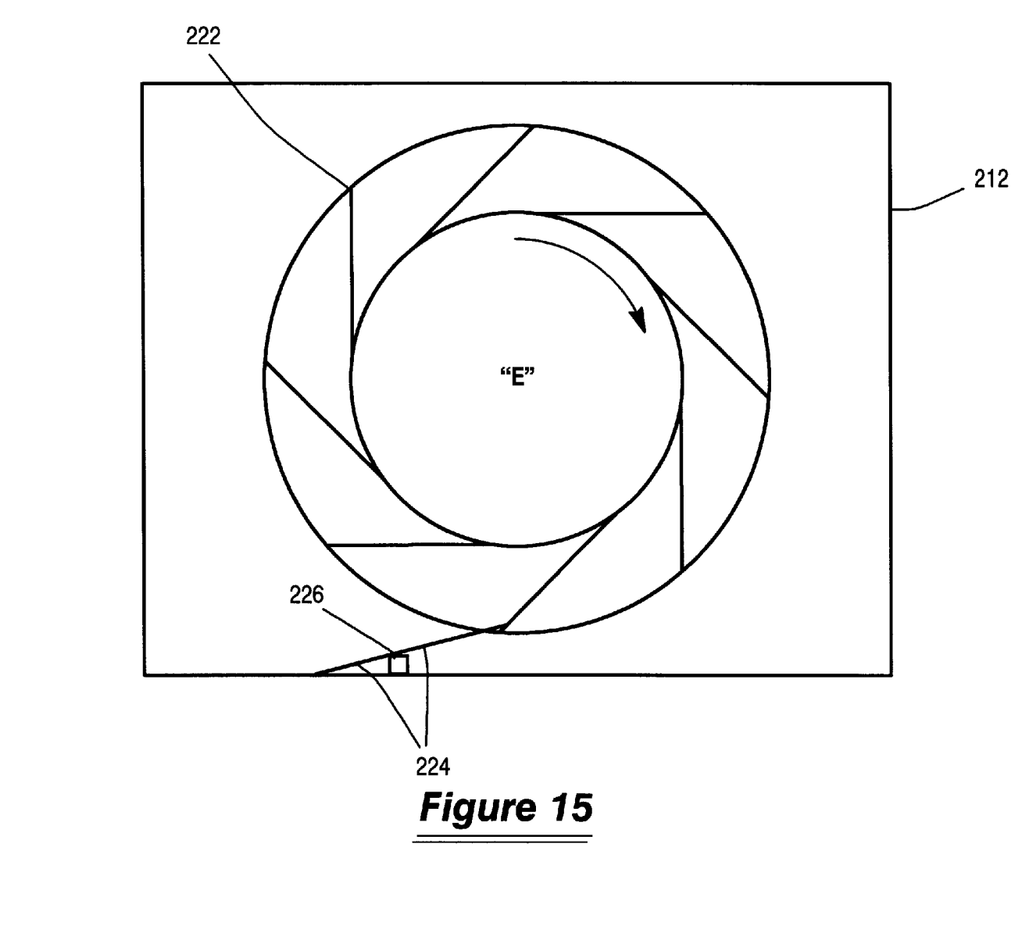
FIG. 15 is a schematic front view of the portion of the air mover system shown in FIG. 13, in the event of reverse rotation.

Referring now to FIG. 14, impeller wheel 222 is shown in a stop or "at rest" position. In such position, in the absence of radially outwardly directed air flow, the breaking arm 224 is substantially straight in its relaxed position and it extends inwardly from stop 226 toward wheel 222. In the event that the impeller fails, or for some other reason, impeller wheel 222 begins to rotate in a reverse direction "E" as shown in FIG. 15, then a radially-extending blade of impeller wheel 222 will come into contact with an end portion of breaking arm 224. Such contact prevents further reverse rotation of impeller wheel 222.

Figure 16:
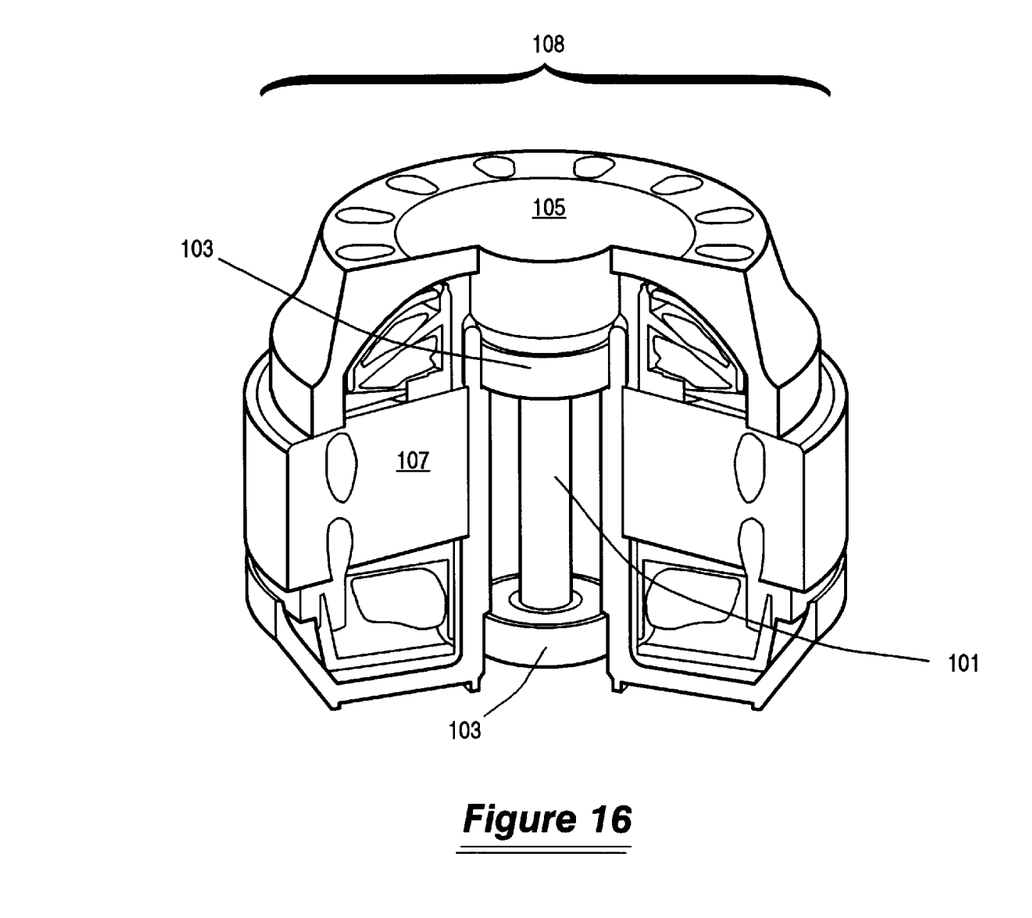
FIG. 16 is a perspective view of an embodiment of a component of an air mover adapted for use in an air mover system according to this invention.

Another embodiment of a means for preventing reverse rotation will now be described with reference to FIG. 16. FIG. 16 illustrates a cut-away view of an external rotor motor such as those offered by McLean Engineering. The motor 108 is adapted to cause rotation about an axis defined by a shaft 101. A pair of bearings 103 is connected to shaft 101 to permit rotation. A rotor 105 and a stator 107 are provided in the usual manner to cause forward rotation.

Although motors conventionally used in air movers such as impellers permit forward and rearward rotation by means of bearings such as bearings 103, one embodiment of a means for preventing reverse rotation according to this invention is a substitution of bearings that are adapted to prevent reverse rotation. For example, drawn cup roller clutch bearings are provided by Torrington Company of Torrington, Conn. Such bearings can be assembled into a motor of an impeller for operating an impeller wheel so that the impeller wheel is only capable of rotating in a forward direction and is prevented from rotating in a rearward direction. Accordingly, such a mono-directional bearing provides a means connected to the motor and to the rotating member for preventing reverse rotation.

It has been discovered that the prevention of reverse rotation of a failed or failing air mover significantly reduces the detrimental effect of such a failure on the overall performance of the air mover system. More specifically, it will be understood that a failed air mover that is free to rotate in a direction opposite to the intended direction will result in significant reverse air flow although forward air flow is intended. Reverse rotation such as that caused by a low pressure zone encourages reverse air flow. Maintaining the failed air mover in a stationary position to prevent reverse rotation reduces the amount of reverse air flow. This has been discovered to reduce the detrimental impact of an air mover failure in an air mover system having multiple air movers despite the fact that some air may still be able to flow through openings in the impeller wheel or other rotating mechanism of the air mover.

EXAMPLE

Figure 17:
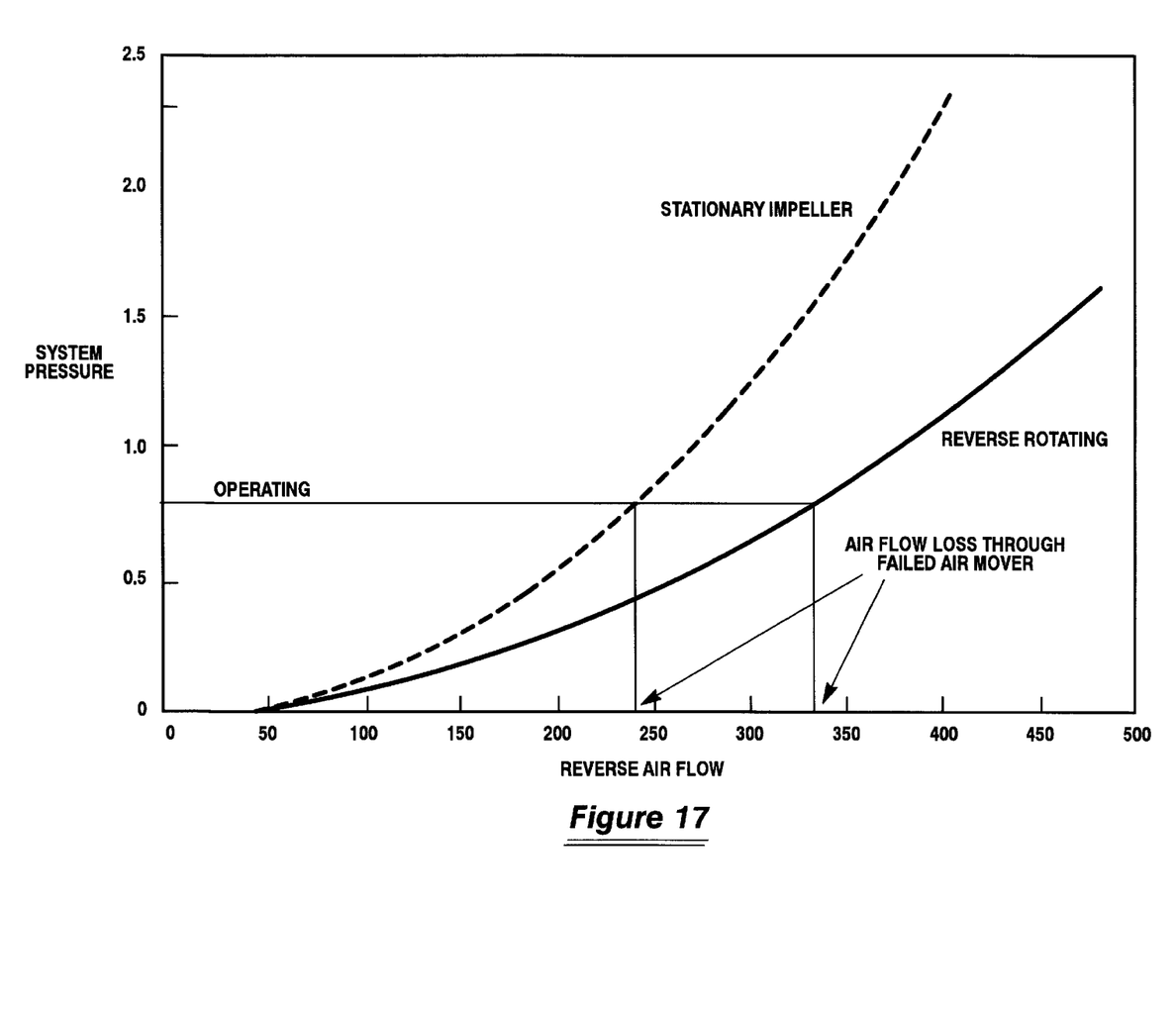
FIG. 17 is a graph illustrating the relationship between the rate of reverse air flow and the system pressure within an enclosure.

Referring now to FIG. 17, a graph is provided to illustrate the relationship between the rate of reverse air flow (measured in cubic feet per minute) and the system pressure within an enclosure (measured in inches of $H_2O$). The dashed curve in FIG. 17 represents the relationship between reverse air flow and system pressure for a stationary air mover that is prevented from reverse rotation. The solid curve is the relationship between reverse air flow and system pressure for an air mover that is capable of reverse rotation.

As indicated in FIG. 17, for an operating system pressure of about 0.8 inches of $H_2O$, the reverse air flow rate through the stationary air mover is only about 240 cubic feet per minute as compared to a rate of about 330 cubic feet per minute for the air mover that is capable of reverse rotation. Accordingly, by preventing reverse rotation of the air mover, the undesirable reverse air flow is reduced by about 90 cubic feet per minute (more than about 25 percent). This significant reduction in reverse air flow helps to maintain the desired air flow pattern across the electronic components so that heat dissipation can be maintained.

This improved system performance is accomplished according to this invention without the need for louver systems mounted adjacent to enclosure openings in order to prevent reverse air flow and without the need for back-up air movers mounted in series to maintain air flow in the event of a failed air mover. Such louver systems and back-up air movers are expensive and require clearance space or additional space that is frequently unavailable.

Although this invention has been described with reference to various embodiments selected for illustration in the drawings, as well as variations and modifications to those embodiments, it will be appreciated that many additional modifications can be made without departing from the spirit or scope of this invention. This invention applies generally to any air mover system that utilizes multiple air movers that urge flow along multiple air flow paths.

The structure or type of the individual air movers is not critical to the invention. Although impellers with impeller wheels have been described as preferred components of the invention, it is contemplated that other rotating means for generating air flow can be substituted.

Also, the means by which reverse rotation is prevented is not critical to the invention. Although breaking arms and clutch bearings have been described as preferred components of the invention, it is contemplated that other means can be employed as well so long as the rotating member of an air mover that urges air flow through the air mover cannot be moved in a direction that would encourage significant reverse flow. A breaking arm is one example of a means positionable for contact between the rotating member and a stationary structure for preventing reverse rotation. Similarly, a clutch bearing is one example of a means positionable for connection between the rotating member and a motor for preventing reverse rotation. Equivalent means can be substituted.

The orientation of the various air movers of an air mover system according to this invention can vary significantly. The axes of rotation can be oriented vertically, horizontally, or in any other direction or combined directions. The axes of rotation of the air movers can be common, parallel to one another, or at angles with respect to one another, depending upon the desired air flow directions.

The enclosure of an air mover system according to this invention can have an interior region that is completely or just partially enclosed. The enclosure can house electronics and air movers in a common interior or, alternatively, the enclosure can house the air movers for mounting to a separate structure that houses the electronics to be cooled. Also, the air movers can be positioned upstream or downstream from the electronics to be cooled.

Many additional variations can be made without departing from the scope of this invention, which is defined separately in the appended claims.

What is claimed:

1. A system for moving air through an enclosure, said system comprising:
   air movers each mounted within said enclosure and each oriented to generate air flow through an interior of said enclosure along respective air flow paths;
   each of said air movers having means mounted for forward rotation to generate said air flow; and
   each of said air movers having means for preventing reverse rotation of said air flow generating means, thereby preventing said reverse rotation of said air flow generating means of a failed or failing air mover in response to air flow through another air mover, and thereby reducing reverse air flow along said air flow path of said failed or failing air mover.

2. The system defined in claim 1, wherein said means for preventing said reverse rotation comprises an arm mounted adjacent to said air flow generating means and to said enclosure, said arm being positioned to permit said forward rotation of said air flow generating means with respect to said enclosure and to prevent said reverse rotation of said air flow generating means with respect to said enclosure.

3. The system defined in claim 2, wherein said arm is mounted to said enclosure proximal to said air flow generating means.

4. The system defined in claim 2, wherein said arm is mounted to said air flow generating means proximal to said enclosure.

5. The system defined in claim 1, each of said air movers having a motor connected to said air flow generating means for causing said forward rotation of said air flow generating means.

6. The system defined in claim 1, wherein said air flow generating means comprises an impeller wheel.

7. The system defined in claim 1, wherein said air flow generating means comprises a fan blade.

8. A system for moving air through an enclosure, said system comprising:
   air movers each mounted within said enclosure and each oriented to generate air flow through an interior of said enclosure along respective air flow paths;
   each of said air movers having means mounted for forward rotation to generate said air flow; and
   each of said air movers having means positioned for contact with said air flow generating means for preventing reverse rotation of said air flow generating means, thereby preventing said reverse rotation of said air flow generating means of a failed or failing air mover in response to air flow through another air mover, and thereby reducing reverse air flow along said air flow path of said failed or failing air mover.

9. The system defined in claim 8, wherein said means for preventing said reverse rotation comprises a bearing adapted to permit said forward rotation and to prevent said reverse rotation.

10. A system for moving air through an enclosure, said system comprising:
air movers each mounted within said enclosure and each oriented to generate air flow through an interior of said enclosure along respective air flow paths;
each of said air movers having an impeller wheel mounted for rotation in a forward direction to generate said air flow;
each of said air movers having a motor coupled with said impeller wheel for rotating said impeller wheel in said forward direction; and
each of said air movers further comprises a bearing connected to permit said forward rotation of said impeller wheel and prevent reverse rotation of said impeller wheel.

11. The system defined in claim 10, wherein said impeller wheel is connected to a shaft and said bearing is connected to said shaft, wherein said bearing permits said forward rotation of said impeller wheel and prevents reverse rotation of said impeller wheel.

12. An air mover system adapted to urge air flow through an interior of an enclosure and through at least one opening defined by said enclosure, said air mover system comprising:
at least two impellers each having impeller wheels mounted for rotation;
a motor coupled to each of said impeller wheels for causing rotation of said impeller wheels in a forward direction to urge air flow through said interior of said enclosure; and
each of said impellers having a member positioned to be coupled with said impeller wheel to prevent rotation of each of said impeller wheels in a reverse direction, thereby reducing the amount of reverse air flow through said interior in the event of a failure of one of said impellers.

13. The air mover system defined in claim 12, said member comprising a bearing coupled to each of said impeller wheels, said bearings being adapted to permit said rotation of said impeller wheels and to prevent reverse rotation of said impeller wheels.

14. The air mover system defined in claim 12, said member comprising an arm connected to each of said impeller wheels, said arms being positioned to interfere with said enclosure in the event of reverse rotation of said impeller wheels with respect to said enclosure.

15. The air mover system defined in claim 14, said arms being connected to said impeller wheels by means of pivots permitting movement of said arms between an extended position for contact with said enclosure to prevent said reverse rotation and a retracted position to avoid said contact during forward rotation.

16. The air mover system defined in claim 12, said member comprising an arm connected to said enclosure adjacent to each of said impeller wheels, said arms being positioned to interfere with said impeller wheels in the event of reverse rotation of said impeller wheels with respect to said enclosure.

17. The air mover system defined in claim 16, said arms being connected to said enclosure for movement of said arms between an extended position for contact with said impeller wheels to prevent said reverse rotation and a deflected position to avoid said contact during forward rotation.

* * * * *